United States Patent
Jimbo et al.

(10) Patent No.: US 8,699,035 B2
(45) Date of Patent: Apr. 15, 2014

(54) INSPECTION APPARATUS AND INSPECTION METHOD FOR LIGHT EMITTING DEVICE

(75) Inventors: Syu Jimbo, Tokyo (JP); Norie Yamaguchi, Tokyo (JP); Keita Koyahara, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 0 days.

(21) Appl. No.: 13/595,576

(22) Filed: Aug. 27, 2012

(65) Prior Publication Data

US 2013/0050691 A1 Feb. 28, 2013

(30) Foreign Application Priority Data

Aug. 25, 2011 (JP) ................................. 2011-183622

(51) Int. Cl.
*G01B 11/14* (2006.01)
(52) U.S. Cl.
USPC .......................................... 356/614; 356/622

(58) Field of Classification Search
USPC .............. 356/614–615, 620–623, 509, 237.4, 356/237.5; 382/149, 141, 145; 148/DIG. 12, 148/DIG. 28, DIG. 162
See application file for complete search history.

(56) References Cited

FOREIGN PATENT DOCUMENTS

| JP | 08-330372 A | 12/1996 |
|---|---|---|
| JP | 10144631 A | 5/1998 |
| JP | 2003-297884 A | 10/2003 |
| JP | 2010-141208 A | 6/2010 |
| JP | 4646271 B1 | 3/2011 |

*Primary Examiner* — Tri T Ton
(74) *Attorney, Agent, or Firm* — Browdy and Neimark, PLLC

(57) ABSTRACT

An inspection apparatus and an inspection method is provided having a wafer chuck stage equipped with one or more wafer chucks; a position measurement unit for measuring the positions of the light emitting devices on each of the expanded wafers loaded respectively on the wafer chucks; a photodetector and at least one probe provided corresponding to each of the expanded wafers; and a control unit provided with means for moving the wafer chuck stage in the X axis and/or Y-axis directions such that the light emitting devices on each of the expanded wafers are sequentially brought under the corresponding probes, means for moving each of the probes to a place corresponding to the electrodes in the light emitting devices, and means for bringing the probes into contact with the corresponding electrodes.

10 Claims, 11 Drawing Sheets

INSPECTION APPARATUS AND INSPECTION METHOD FOR LIGHT EMITTING DEVICE

BACKGROUND OF THE INVENTION

1. Field of the Invention

The present invention relates to an inspection apparatus and an inspection method for light emitting devices, and in particular, it relates to the inspection apparatus and the inspection method for inspecting optical properties of the light emitting devices such as LED devices on an expanded wafer.

2. Description of the Related Art

In inspecting semiconductor devices formed on a wafer, it is a major challenge how to increase the number of inspection objects per unit time, in order to bring down inspection costs. However, on the expanded wafer, after the semiconductor devices are subjected to dicing and expanded on a tape, spacing between the semiconductor devices being the inspection targets is not constant and, further, is different on every wafer. Therefore, it is necessary prior to probing to acquire positional information of each semiconductor devices on every wafer, and this is a significant hurdle for increasing the number of inspection objects per unit time.

Particularly, in the case where the semiconductor devices to be inspected are light emitting devices such as LED devices, for instance, and where optical properties such as brightness and chromaticity of the devices are inspected, it is necessary to place a photodetector in proximity to the light emitting device to be inspected. By way of example, when an integrating sphere equipped with an optical detector is employed as the photodetector, its external dimensions are approximately the same as the expanded wafer, in general. Therefore, only one photodetector is allowed to be placed for one expanded wafer, which imposes a restriction that the inspection on the optical properties of the light emitting devices is able to be performed one by one only.

On the other hand, the Japanese Patent No. 4646271, for instance, which will be hereinafter referred to as the patent document 1, suggests an inspection apparatus for semiconductor devices separated individually by dicing process on a wafer. The apparatus here employs two probes, each of which is brought into contact with one semiconductor device, and inspects the electrical properties of two semiconductor devices simultaneously, thereby trying to achieve reduction of inspection time. Furthermore, it is said that this apparatus is also able to inspect optical properties by installing a photodetector.

However, in the apparatus according to the patent document 1, the photodetector is positioned to be able to detect only the vicinity of one of the two probes, and thus it is not possible to expect reduction of the inspection time as for the inspection of the optical properties.

The present invention has been made to overcome the drawbacks of the conventional technique as mentioned above, and an object of the present invention is to provide an inspection apparatus and an inspection method which are able to enhance efficiency of the inspection on the optical properties of the light emitting devices on an expanded wafer and to increase the number of inspection objects per unit time.

SUMMARY OF THE INVENTION

The inventors of the present invention have diligently made studies over and over in order to solve the above mentioned drawbacks and found that it is possible to inspect light emitting devices on more than one expanded wafers simultaneously when one wafer chuck stage is equipped with plural wafer chucks, and each of the wafer chucks is equipped with corresponding probes and a photodetector, thereby being able to dramatically increase the number of the devices inspected per unit time, and accomplished the present invention.

The present invention solves the above mentioned drawbacks by providing an inspection apparatus for inspecting light emitting devices on an expanded wafer, comprising, 1) a position measurement part comprising a wafer chuck stage equipped with more than one wafer chucks, and a position measurement unit which measures relative positions to a standard point, of the light emitting devices on each of the expanded wafers loaded on the wafer chucks, and stores the relative positions as light emitting devices positional information, 2) an inspection part comprising a photodetector and one or more than one probes provided per each of the expanded wafers loaded on the wafer chucks, and probe moving stages which move each of the probes independently in the X-axis, Y-axis, and Z-axis directions, and 3) a control unit comprising, means for moving the wafer chuck stage in the X-axis and/or Y-axis directions in such a manner that the light emitting devices on each of the expanded wafers are sequentially placed under the corresponding one or more than one probes, based on the light emitting devices positional information, means for actuating the probe moving stages to move each of the probes in the X-axis and/or Y-axis directions, based on the light emitting devices positional information and positional information of electrodes in the light emitting devices, so that each of the probes is brought to a place corresponding to each of the electrodes in the light emitting devices under the probes, and means for moving the probes in the Z-axis direction with respect to the wafer chuck stage so as to bring the probes into contact with the corresponding electrodes in the light emitting devices.

According to the aforementioned inspection apparatus of the present invention, it is possible to perform simultaneously the inspection on optical properties of the light emitting devices on one or more expanded wafers respectively loaded on plural number of wafer chucks. Therefore, the number of devices inspected per unit time becomes a multiple of the number of the wafer chucks and the number of devices inspected per unit time increases drastically.

In one preferred aspect of the inspection apparatus according to the present invention, the position measurement unit measures, in addition to the light emitting devices positional information, relative positions to a standard point, of the electrodes in each of the light emitting devices, and stores the measured relative positions as the electrodes positional information. In the case where the position measurement unit stores the electrodes positional information in addition to the light emitting devices positional information, it is possible to locate, based on the electrodes positional information, each of the probes more precisely in such a manner that each of the probes is brought into contact with the corresponding electrode. It is to be noted that when the position data of electrodes in the light emitting devices are provided from outside in the form of wafer information, for instance, the positions data of electrodes thus provided may be stored in the position measurement unit as reference information about the positions of electrodes and utilized as appropriate.

Furthermore, in one preferred aspect of the inspection apparatus according to the present invention, the inspection part comprises photodetector moving stages which move each of the photodetectors independently in the X-axis, Y-axis, and Z-axis directions, and means for moving each of the photodetectors in the X-axis, Y-axis, and/or Z-axis directions in linking with the movement of the corresponding any of one or more than one probes. When the inspection apparatus of the present invention is able to move each of the photodetectors independently in the X-axis, Y-axis, and Z-axis directions, it is possible to position each of the photodetectors at the most optimum location for inspecting the optical properties of the light emitting devices to be inspected, and also to put aside the photodetectors appropriately. Further, when the inspection apparatus of the present invention is able to move each of the photodetectors in the X-axis, Y-axis, and Z-axis directions in linking with the movement of the corresponding any of one or more than one probes, it is possible to maintain relative positional relationships between the photodetectors and the probes constantly even when the positions of the probes are changed depending on the individual expanded wafers or the positions of the electrodes in each of the light emitting devices to be inspected, and even when the probes are moved in the Z-axis direction to come into contact with the electrodes on the light emitting device to be inspected.

Furthermore, in one preferred aspect, the inspection apparatus according to the present invention is provided with two or more position measurement parts for one inspection part, wherein the inspection part and each of the position measurement parts are placed at locations different from one another, and the control unit comprises means for moving the wafer chuck stages between the inspection part and each of the position measurement parts, means for moving one of the wafer chuck stages from one of the position measurement parts to the inspection part, after having been stored the light emitting devices positional information, or both of the light emitting devices positional information and the electrodes positional information by the position measurement unit, when the other wafer chuck stage does not exist in the inspection part, and means for moving one of the wafer chuck stages on which inspections in the inspection part are completed, from the inspection part to the position measurement part where the one wafer chuck stage was previously located.

When the inspection apparatus of the present invention is provided with two or more position measurement parts for one inspection part as described above and comprises means for moving the wafer chuck stages between the inspection part and each of the position measurement parts, while the inspections are being performed on the optical properties of the light emitting device on one expanded wafer, it is possible to measure the positions of the light emitting devices and additionally the positions of the electrodes on another expanded wafer. Therefore, the inspection time is drastically reduced in total, and tremendous increase of the number of the devices inspected per unit time.

The present invention solves the above mentioned drawbacks by further providing an inspection method for light emitting devices on an expanded wafer, comprising, a) a step of loading the expanded wafers on respective wafer chucks provided in plural on a wafer chuck stage, b) a step of measuring relative positions to a standard point, of the light emitting devices on each of the expanded wafers loaded on the wafer chucks, and storing the relative positions, as light emitting devices positional information, c) a step of moving the wafer chuck stage in the X-axis and/or Y-axis directions based on the light emitting devices positional information to place the light emitting devices which are to be inspected on each of the expanded wafers under a photodetector and one or more than one probes being provided corresponding to each of the expanded wafers loaded on the wafer chucks, d) a step of moving each of the probes in the X-axis and/or Y-axis directions, based on the light emitting devices positional information and electrodes positional information in each of the light emitting devices, to bring each of the probes to a location corresponding to each of the electrodes of the light emitting devices positioned below, e) a step of moving the probes in the Z-axis direction with respect to the wafer chuck stage, to bring each of the probes into contact with the corresponding electrodes in the light emitting devices respectively, and performing inspections of the light emitting devices, and f) a step of changing the light emitting device targeted for the inspections on each of the expanded wafers, and repeating the steps of the aforementioned c), d), and e) for all the light emitting devices to be inspected on each of the expanded wafers.

According to the inspection method of the present invention, it is possible to simultaneously perform the inspections on the optical properties of the light emitting devices on one or more expanded wafers which are loaded on one or more wafer chucks, respectively, and to dramatically increase of the number of the devices inspected per unit time.

In one preferred aspect of the inspection method according to the present invention, the aforementioned step b) further comprises a step of measuring relative positions to a standard point, of the electrodes on the light emitting devices and storing the relative positions as the electrodes positional information in addition to the light emitting devices positional information. In the case where the aforementioned step b) comprises the step of measuring and storing the electrodes positional information, in addition to the light emitting devices positional information, it is possible to position each of the probes more precisely based on the electrodes positional information so that the probes are brought into contact with each of the corresponding electrodes. It is to be noted that when the position data of the electrodes in each of the light emitting devices are provided from outside in the form of wafer information, for instance, the position data of the electrodes thus provided may be stored as reference information about the positions of electrodes and utilized as appropriate.

In one preferred aspect of the inspection method according to the present invention, the aforementioned step d) further comprises a step of moving the photodetectors in the X-axis and/or Y-axis directions in linking with the movement in the X-axis and/or Y-axis directions of any of the corresponding probes. In the case where the step d) comprises the aforementioned step, it is possible to maintain relative positional relationships between each of the photodetectors and the corresponding probes so that each of the photodetectors is constantly placed at an optimum location for the inspections, even when the positions of the probes are changed depending on each of the expanded wafers, or depending on the positions of the electrodes on the individual light emitting devices to be inspected.

Furthermore, in one preferable aspect of the inspection method according to the present invention, the aforementioned step e) comprises a step of moving each of the photodetectors in the Z-axis direction in linking with the movement in the Z-axis direction of any of the corresponding probes. In the case where the step e) comprises the aforementioned step, relative positional relationships between each of the photodetectors and the corresponding probes are maintained, even when the probes are moved in the Z-axis direction so as to be brought into contact with the electrodes of the light emitting devices to be inspected, thereby it is possible to place each of the photodetectors at a location optimum for inspecting the optical properties constantly.

In one preferable aspect of the inspection method according to the present invention, at least the step e) performed first, among the steps e) performed on all the light emitting devices to be inspected on each of the expanded wafers, comprises a step of moving each of the photodetectors in the X-axis and/or Y-axis directions independent from the corresponding probes to position each of the photodetectors at a place where light quantity being detected is maximized. In the case where the step e) comprises the aforementioned step, it is possible to position each of the photodetectors at a place optimum for inspecting the optical properties.

Further, in one preferable aspect, the inspection method according to the present invention is a method, wherein two or more wafer chuck stages are moved between a respective position measurement location and a common inspection location, and wherein, following steps are performed for each of the wafer chuck stages;

g) a step of performing the steps a) and b) at the position measurement location, h) a step of moving the wafer chuck stage from the position measurement location to the common inspection location, i) a step of performing the steps c) to f) at the common inspection location, j) a step of moving the wafer chuck stage from the common inspection location to the position measurement location, and k) a step of unloading the expanded wafers from the wafer chucks at the position measurement location, and the step i) for one of the wafer chuck stages is performed simultaneously with the step g) for the other one or more wafer chuck stages at least partially in parallel.

In the case where the inspection method of the present invention moves two or more wafer chuck stages between the respective position measurement locations and the common inspection location and comprises the steps g) to k) above mentioned, it is possible to measure the positional information of light emitting devices on one expanded wafer, and to inspect the optical properties of light emitting devices on the other expanded wafer simultaneously in parallel, thereby it is possible to reduce drastically the total inspection time and to increase the number of the devices inspected per unit time significantly.

It is to be noted that light emitting devices inspected by the inspection apparatus and the inspection method according to the present invention are typically LED devices, but not limited to LED devices only. Any devices may be inspected by the inspection apparatus and the inspection method of the present invention as far as they are formed on a wafer, and emit light when electric power is supplied from outside. The optical properties being inspected by the inspection apparatus and the inspection method of the present invention are, for example, brightness, chromaticity, emission wavelength, and the like, but not limited to them. Any optical properties are inspected by the inspection apparatus and the inspection method of the present invention as far as they are able to be inspected by a photodetector. In addition, while the inspection apparatus and the inspection method of the present invention are mainly suitable for the inspections on optical properties of light emitting devices, it is a matter of course that, in addition to optical properties, electrical properties, such as DC properties and ESD application test of light emitting devices may be also inspected by the inspection apparatus and the inspection method of the present invention.

According to the inspection apparatus and the inspection method for light emitting devices of the present invention, since the optical properties of the light emitting devices on one or more expanded wafers are able to be inspected simultaneously, there is an advantage that the number of the devices inspected per unit time can be dramatically increased. In addition, when the inspection apparatus and the inspection method for light emitting devices of the present invention uses two or more position measurement parts and/or two or more wafer chuck stages, it is possible to conduct measurements of the positions of the light emitting devices and/or the electrodes on the expanded wafers and the inspection of the optical properties by probing at different places. In other words, while the optical properties of the light emitting devices on one expanded wafer are being inspected, it is possible to perform the measurements of the positions of the light emitting devices and/or the electrodes on the other expanded wafers. Therefore, there is an advantage that the total inspection time can be drastically reduced, and the number of the devices inspected per unit time can be significantly increased.

DESCRIPTION OF THE PREFERRED EMBODIMENTS

Hereinafter, with reference to the accompanying drawings, the present invention will be explained in detail. As a matter of course, the present invention is not limited to those illustrated examples.

Figure 1:
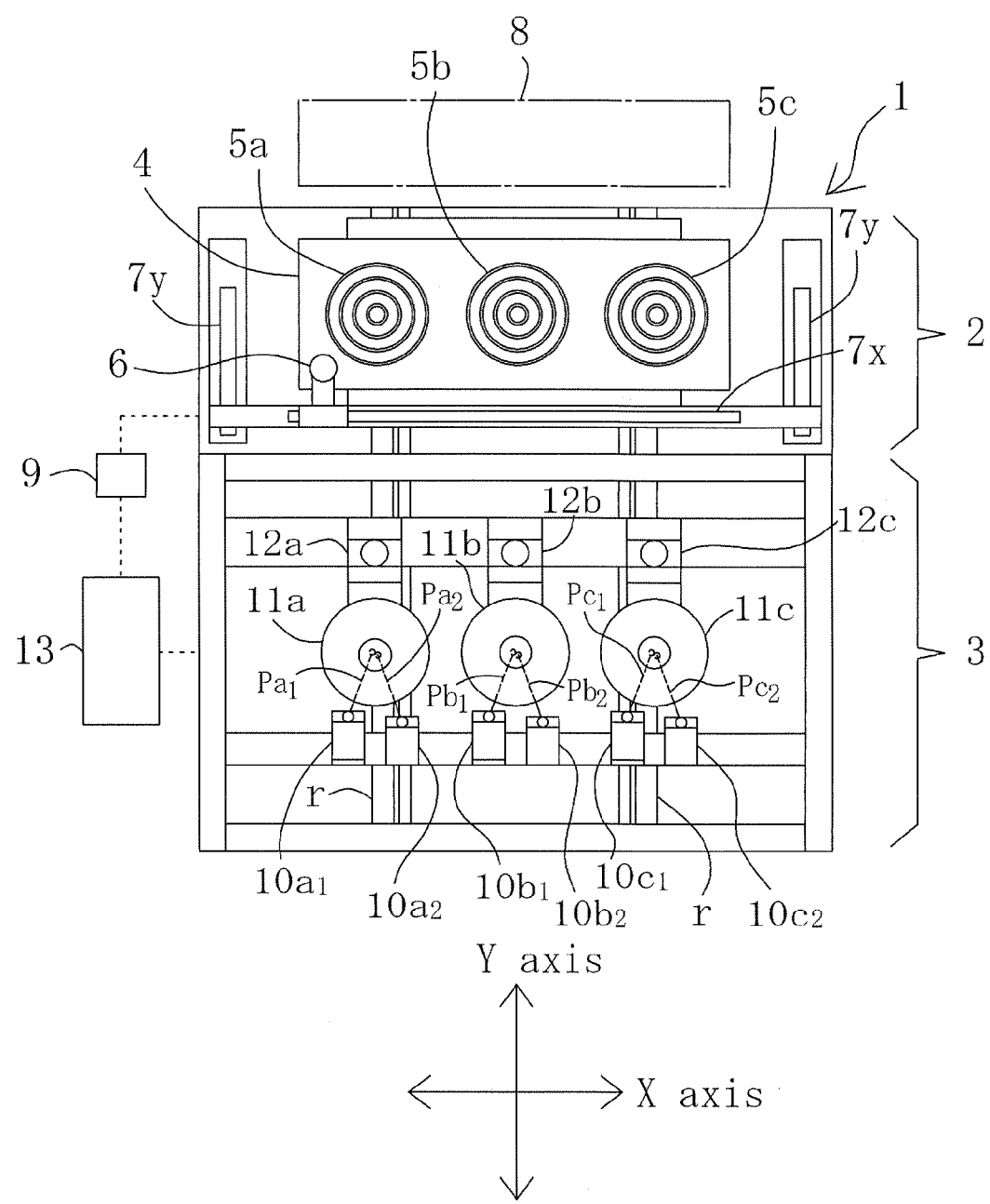
FIG. 1 is a plan view showing one example of the inspection apparatus according to the present invention.

FIG. 1 is a plan view showing one example of the inspection apparatus for light emitting devices according to the present invention. In FIG. 1, the reference numeral 1 indicates the inspection apparatus for light emitting devices according to the present invention, the reference numeral 2 indicates a position measurement part, and the reference numeral indicates an inspection part. The position measurement part 2 is provided with a wafer chuck stage 4, and the wafer chuck stage 4 is mounted on an XY stage which is movable in the XY axis directions orthogonal with each other within a horizontal plane, as described below. The wafer chuck stage 4 is provided with three wafer chucks 5a, 5b, and 5c. Those three wafer chucks 5a, 5b, and 5c are respectively mounted on θ stages not illustrated, and they are allowed to independently perform θ rotation about the axis passing through each center of the wafer chucks 5a, 5b, and 5c. The wafer chucks 5a to 5c may employ any mechanism as far as they are able to fix expanded wafers temporarily on the respective top surfaces of the wafer chucks 5a, 5b, and 5c. Typically, it is preferable to employ a mechanism using vacuum which fixes the expanded wafers on the top surface of the wafer chuck stage 4 by vacuum.

The reference numeral 6 indicates a camera mounted on the position measurement part 2 for measuring the positions of devices and electrodes. The camera 6 is movable in any of the X-axis direction along the guide 7x in the lateral direction in the figure, and the Y-axis direction along the guide 7y in the vertical direction in the figure. The reference numeral 8 indicates wafer transfer equipment for loading or unloading the expanded wafers on or from the wafer chucks 5a to 5c on the wafer chuck stage 4. Any appropriate unit may be employed as the wafer transfer equipment 8. The reference character r indicates Y-axis rail, and as described below, they serve as transfer guides for moving of the wafer chuck stage 4, from the position measurement part 2 to the inspection part 3, or from the inspection part 3 to the position measurement part 2 in the opposite direction.

The reference numeral 9 indicates a position measurement unit provided in the position measurement part 2. The position measurement unit 9 actuates a drive mechanism not illustrated to move the camera 6 along the guides 7x and 7y in the directions of the X axis and the Y axis, and takes image data throughout the top surfaces of the expanded wafers being loaded on the wafer chuck stage 4. The position measurement unit 9 is provided with a function for subjecting the acquired image data to an image processor to measure a relative position of a light emitting device to a standard point, as to all of the light emitting devices on the expanded wafers. The position measurement unit 9 stores thus measured information regarding the relative positions of the light emitting devices in a storage unit, as light emitting devices positional information. Any point can be selected as standard point of the relative positions of the light emitting devices as far as a constant positional relationship between the point and the hardware of the position measurement part 2 is maintained constantly. By way of example, a starting point of the camera 6 on the movement in the X-axis and Y-axis directions along the guides 7x and 7y may be selected as the standard point. On this occasion, it is possible to store travel distances of camera 6 in the X-axis and/or Y-axis directions, as they are, as relative positional information of the light emitting devices, and therefore this is advantageous.

The image data taken by the camera 6 also includes image data of electrodes in each light emitting devices, and thus, the position measurement unit 9 is also able to measure, by subjecting the image data to an image processor, relative positions to a standard point of the electrodes in each of the light emitting devices, in addition to the aforementioned light emitting devices positional information. The position measurement unit 9 stores thus measured relative positions of the electrodes to a standard point as electrodes positional information. It is to be noted that any point can be selected as the standard point for measurement of the relative positions of the electrodes, same as in the measurement of the relative positions of the light emitting devices. By way of example, the starting point of the camera 6 on the movement in the X-axis and Y-axis directions may be selected as the standard point, which is same as that in the light emitting devices positional information. Alternatively, the already measured relative positions of light emitting devices can be used as a standard point. In the case where information regarding the positions of electrodes on each of the light emitting devices is supplied from the outside in the form of wafer information, the position measurement unit 9 may also store thus supplied information concerning the positions of electrodes, as electrodes positional reference information, and utilize it as appropriate.

Although, in the example being illustrated, the position measurement unit 9 is provided separately from below described control unit 13 the position measurement unit 9 may exist as a part of the control unit 13. Further, although, in the example being illustrated, the location where the expanded wafers are loaded or unloaded on or from the wafer chuck stage is identical to the location where the camera 6 measures the positions of the light emitting devices loaded on the expanded wafers, those two locations may be different from each other. In other words, after the expanded wafers are loaded on the wafer chuck stage 4, the wafer chuck stage 4 may be transferred to the location where the camera 6 can take image data.

On the other hand, the inspection part 3 is provided with probes $Pa_1$ to $Pc_2$ and photodetectors 11a to 11c. The probes $Pa_1$, $Pa_2$ and the photodetector 11a are provided corresponding to an expanded wafer loaded on the wafer chuck 5a, the probes $Pb_1$, $Pb_2$ and the photodetector 11b are provided corresponding to an expanded wafer loaded on the wafer chuck 5b, and the probes $Pc_1$, $Pc_2$ and the photodetector 11c are provided corresponding to an expanded wafer loaded on the wafer chuck 5c, respectively.

In the present example, two probes are provided for one expanded wafer. However, the number of probes per expanded wafer is not limited to two. Appropriate number of probes may be provided depending on the number of electrodes on each of the light emitting devices to be inspected. Further in the present example, each of the photodetectors 11a to 11c is an integrating sphere having a light input port and a light detector, as described below. However, there are no any particular restrictions on the type of the photodetectors 11a to 11c, as far as they are capable of inspecting optical properties of light emitting devices.

The probes $Pa_1$, $Pa_2$, $Pb_1$, $Pb_2$, $Pc_1$, and $Pc_2$ are provided with probe moving stages $10a_1$, $10a_2$, $10b_1$, $10b_2$, $10c_1$, and $10c_2$, respectively, which move the respective probes independently in the X-axis, Y-axis, and Z-axis directions. The photodetectors 11a, 11b, and 11c are respectively provided with photodetector moving stages 12a, 12b, and 12c, which move the respective photodetectors independently in the X-axis, Y-axis, and Z-axis directions. As described above, since the probes $Pa_1$ to $Pc_2$ and the photodetectors 11a to 11c are provided with the respective moving stages, each of the probes $Pa_1$ to $Pc_2$ and each of the photodetectors 11a to 11c are able to move independently in the directions of the X axis, the Y axis, and the Z axis. However, if necessary, it is possible to change the moving mode so that each of the photodetectors 11a, 11b, and 11c is moved in linking with the movement of either of the corresponding probes $Pa_1$ and $Pa_2$, either of the corresponding probes $Pb_1$ and $Pb_2$, and either of the corresponding probes $Pc_1$ and $Pc_2$, respectively, in the directions of the X axis, the Y axis, and the Z axis.

Such linked movement as described above may be realized by, for example, mechanically coupling the photodetectors $11a$ to $11c$ or the photodetector moving stage $12a$ to $12c$ with any one of the corresponding probes $Pa_1$ to $Pc_2$, or any one of the corresponding probe moving stages $10a_1$ to $10c_2$, respectively. Such linked movement can be also realized by software. For example, when the photodetectors $11a$, $11b$, and $11c$ are to be moved in linking with the probes $Pa_1$, $Pb_1$, and $Pc_1$, respectively, control unit 13 described below may give a command the respective photodetector moving stages $12a$, $12b$, and $12c$ to move the photodetectors $11a$, $11b$, and $11c$ by the same amount in the same X-axis, Y-axis, and/or Z-axis directions, as the probes $Pa_1$, $Pb_1$, and $Pc_1$, respectively. This is also applicable in the same manner, when the photodetectors $11a$, $11b$, and $11c$ are moved in linking with the movement of the probes $Pa_2$, $Pb_2$, and $Pc_2$.

The reference numeral 13 indicates the control unit. The control unit 13 controls the movements of the probes $Pa_1$ to $Pc_2$ and the photodetector $11a$ to $11c$ in the X-axis, Y-axis, and Z-axis directions, via the probe moving stages $10a_1$ to $10c_2$ and the photodetector moving stage $12a$ to $12c$. The control unit 13 also controls the movement of the wafer chuck stage 4 between the position measurement part 2 and the inspection part 3 via a drive mechanism not illustrated, and the movement of the wafer chuck stage 4 in the X-axis and/or Y-axis directions via XY stage described below, and further controls the θ rotation of the wafer chucks $5a$, $5b$, and $5c$ via the θ stages, respectively. Furthermore, the control unit 13 acquires and manages the light emitting devices positional information and the electrodes positional information from the position measurement unit 9, and controls all over the inspection procedures performed in the inspection part 3 to inspect optical properties and, if necessary, electrical properties.

Figure 2:
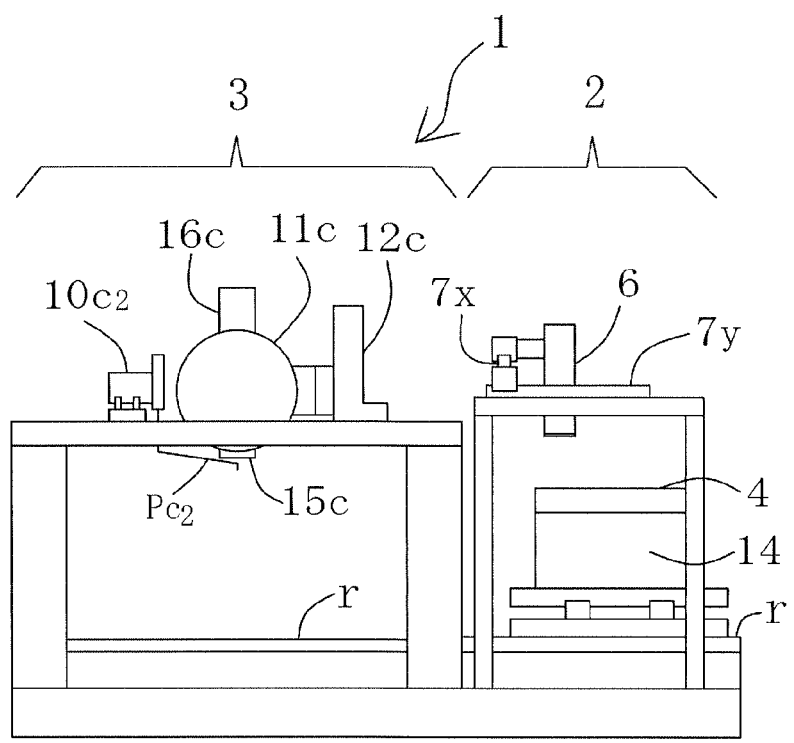
FIG. 2 is a right side view showing one example of the inspection apparatus for light emitting devices according to the present invention.

FIG. 2 is a right side view of the inspection apparatus 1 which is shown in FIG. 1, and the same members are labeled the same as those in FIG. 1. For the sake of convenience, the wafer transfer equipment 8 is not illustrated in FIG. 2. In FIG. 2, the reference numeral 14 indicates the XY stage on which the wafer chuck stage 4 is mounted. The reference numeral $15c$ indicates a light input port of the photodetector $11c$ and the reference numeral $16c$ indicates a light detector of the photodetector $11c$. It is obvious that the photodetectors $11a$ and $11b$, while they are not shown in FIG. 2, are also provided with the input ports $15a$ and $15b$, and the light detectors $16a$ and $16b$, respectively.

Figure 3:
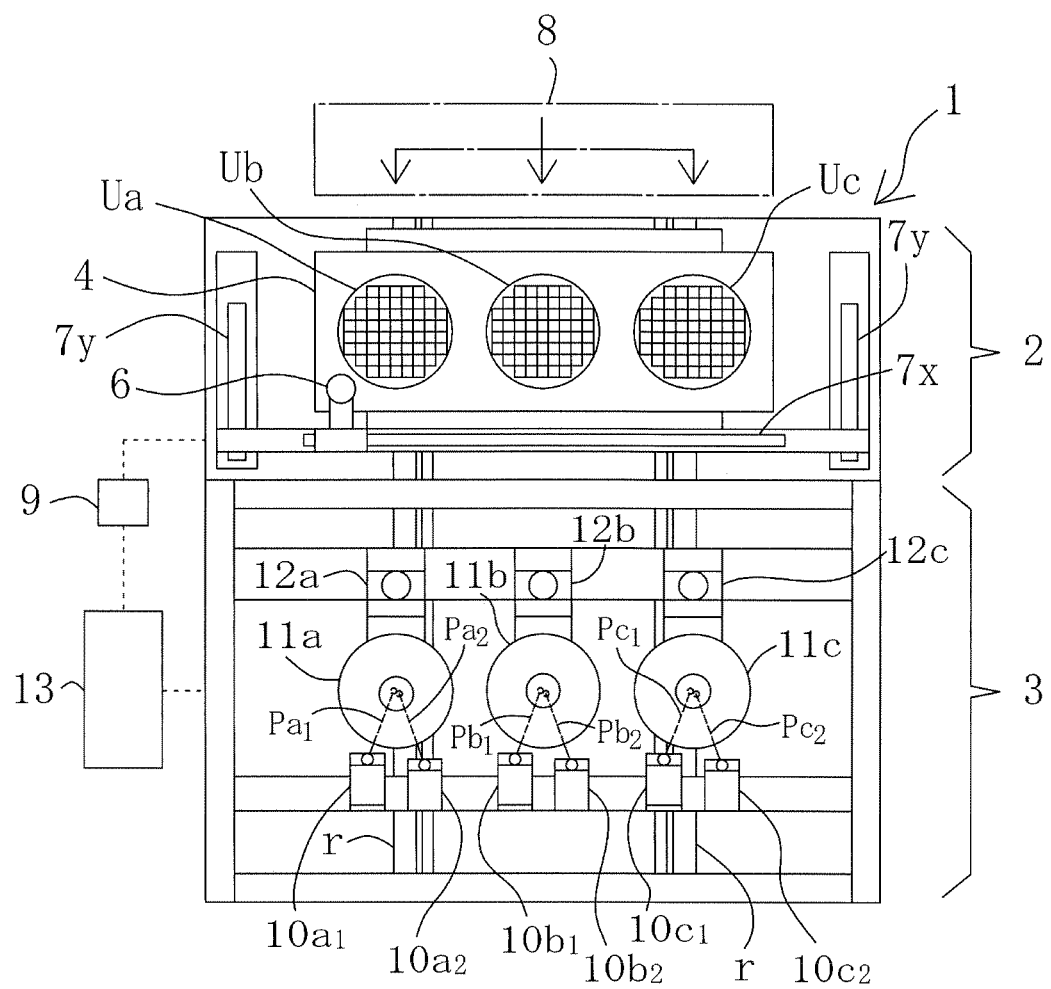
FIG. 3 is a plan view showing the state where expanded wafers are loaded on a wafer chuck stage.
Figure 4:
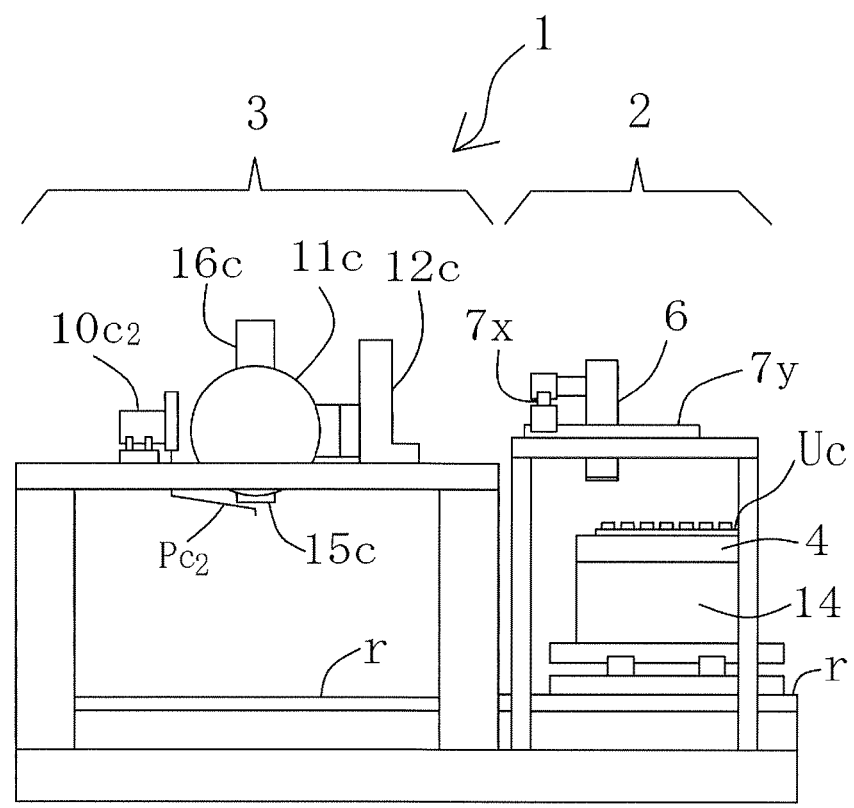
FIG. 4 is a right side view showing the state where the expanded wafers are loaded on a wafer chuck stage.

Next, with reference to FIG. 3 to FIG. 8, an inspection method according to the present invention, which is performed by using the inspection apparatus 1 according to the present invention, will be explained. Firstly, as shown in FIG. 3 and FIG. 4, the wafer transfer equipment 8 loads the expanded wafers Ua to Uc, which are to be inspected, on the wafer chucks $5a$ to $5c$ of the wafer chuck stage 4, respectively. This corresponds to the step a) in the inspection method according to the present invention. When the expanded wafers Ua to Uc are loaded, the position measurement unit 9 is actuated, and moves the camera 6 in the X-axis and/or Y-axis directions along the guides $7x$ and $7y$ to take image data throughout the top surfaces of the expanded wafers Ua to Uc. Then, on the basis of the image data taken by the camera 6, the position measurement unit 9 measures the relative positions of each of the light emitting devices on the expanded wafers Ua to Uc and stored them in the position measurement unit 9, as the light emitting devices positional information. This corresponds to the step b) in the inspection method according to the present invention. On this occasion, if necessary, the position measurement unit 9 measures the relative positions of the electrodes on each of the light emitting devices, in addition to the relative positions of the light emitting devices on the expanded wafers Ua to Uc, and stores the relative positions of the electrodes in the position measurement unit 9 as the electrodes positional information.

At the measurements of the relative positions of each of the light emitting devices on the expanded wafers Ua to Uc, if there are discrepancies between the X-axis direction and/or Y-axis direction of the guides $7x$, $7y$ of the camera 6 and the array directions of the light emitting devices on the expanded wafers Ua to Uc in pre-determined certain angle or more, the control unit 13 turns each of the wafer chucks $5a$, $5b$, and $5c$ in the θ direction through the corresponding θ stages of the wafer chucks $5a$, $5b$, and $5c$ so that the discrepancies fall within the range of the pre-determined certain angle. Thereafter, the position measurement unit 9 measures the relative positions of the light emitting devices on the expanded wafers Ua to Uc and stores them. When the wafer transfer equipment 8 has a pre-alignment function, it is not necessary to turn the wafer chucks $5a$, $5b$, and $5c$ in the θ direction, because the array directions of the light emitting devices on the expanded wafers Ua to Uc coincide with the X-axis and/or Y-axis directions of the guides $7x$ and $7y$ of the camera 6 within the range of the pre-determined certain angle upon loading of the wafers on the wafer chucks $5a$ to $5c$.

Figure 5:
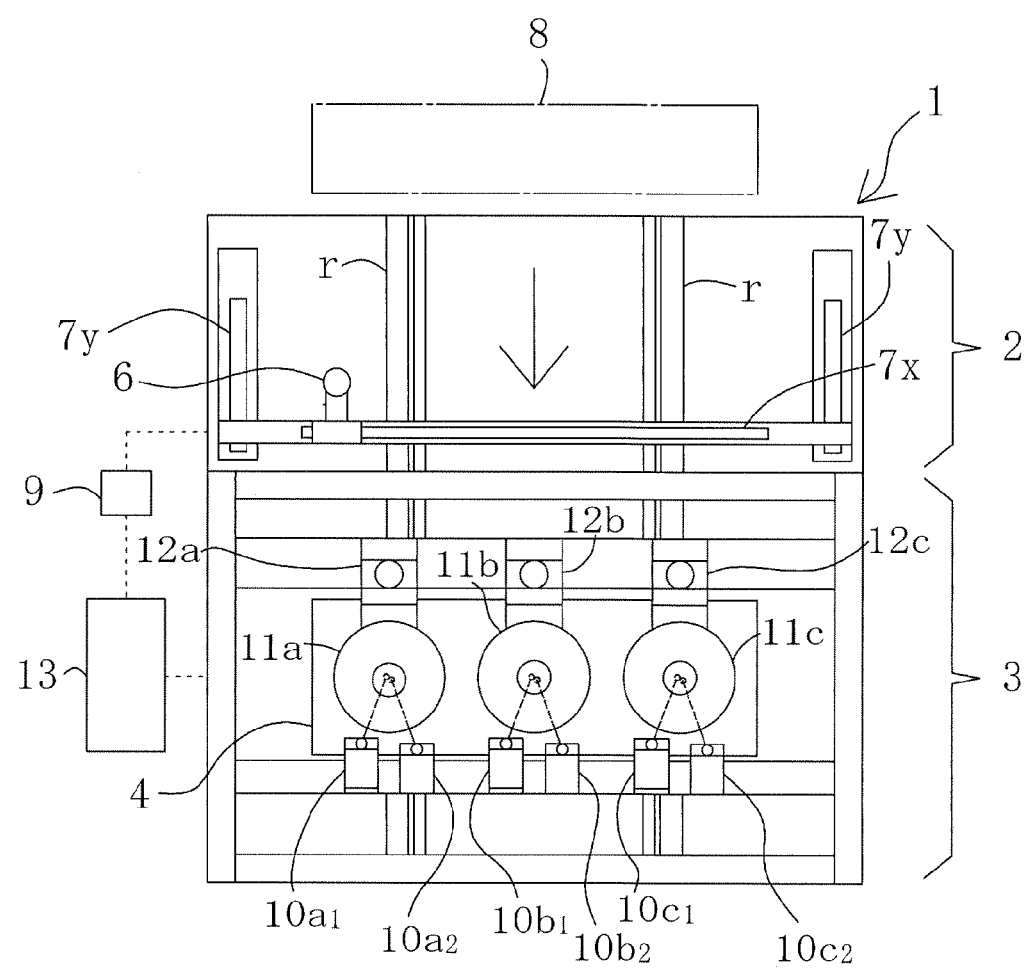
FIG. 5 is a plan view showing the state where the wafer chuck stage is moved from the position measurement part to the inspection part.
Figure 6:
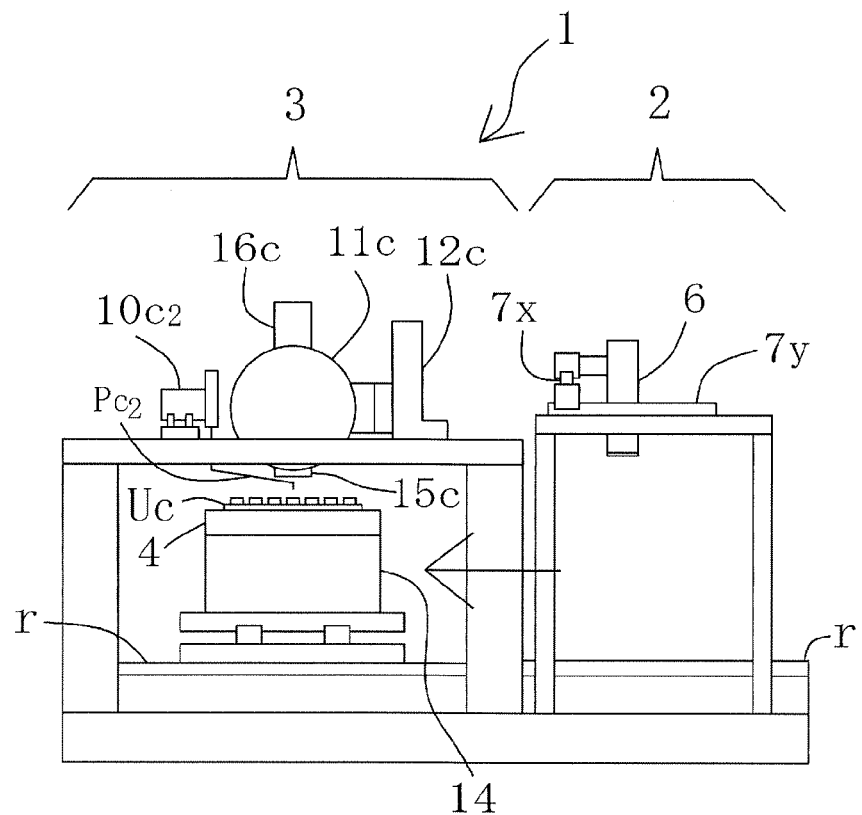
FIG. 6 is a right side view showing the state where the wafer chuck stage is moved from the position measurement part to the inspection part.

When loading the expanded wafers Ua to Uc, measuring and storing the light emitting devices positional information, and optionally measuring and storing the electrodes positional information have been completed, the control unit 13 subsequently actuates a drive mechanism not illustrated to move the wafer chuck stage 4 together with the XY stage 14 to the position of the inspection part 3 as shown in FIG. 5 and FIG. 6. It is to be noted that, in the inspection apparatus 1 of the present example, since the position measurement part 2 and the inspection part 3 are in different locations, it is necessary to move the wafer chuck stage 4 from the position of the position measurement part 2 to the position of the inspection part 3 after the position measurement. However, if the position measurement part 2 and the inspection part 3 are in the same location, it is not necessary to move the wafer chuck stage 4.

When the transfer of the wafer chuck stage 4 to the position of the inspection part 3 is completed, the control unit 13 actuates the XY stage 14 and moves the wafer chuck stage 4 in the directions of the X axis and/or Y axis based on the light emitting devices positional information stored in the position measurement unit 9, so that the light emitting devices to be inspected first are brought under the corresponding probes $Pa_1$ to $Pc_2$ and the photodetectors $11a$ to $11c$, respectively. This corresponds to the step c) in the inspection method of the present invention.

The transfer of the wafer chuck stage 4 at this timing may be performed by moving the wafer chuck stage 4 in the X-axis and/or Y-axis directions based on the position of one light emitting device to be inspected first on any one of the expanded wafers, e.g., the expanded wafer Ua, so that the first light emitting device to be inspected on the expanded wafer Ua is brought under the probes $Pa_1$, $Pa_2$ and the photodetector $11a$, or alternatively by moving the wafer chuck stage 4 in the X-axis and/or Y-axis directions based on the positions of each of one light emitting device to be inspected first on the two or three expanded wafers among the expanded wafers Ua to Uc, so that the displacement between each of the light emitting devices to be inspected first and the corresponding probes $Pa_1$ to $Pc_2$ become minimized.

Figure 7:
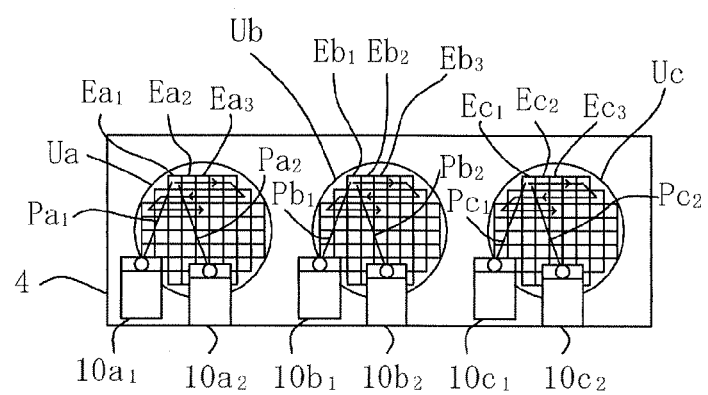
FIG. 7 is a schematic plan view showing the state where the light emitting devices to be inspected first on the expanded wafers are under the corresponding probes.

FIG. 7 shows the state where the light emitting devices to be inspected first on each of the expanded wafers Ua to Uc are brought under the corresponding probes according to the procedure described above. In FIG. 7, the reference characters $Ea_1$, $Ea_2$, $Ea_3$ ... $Eb_1$, $Eb_2$, $Eb_3$ ..., and $Ec_1$, $Ec_2$, $Ec_3$ ... respectively indicate the light emitting devices to be inspected on the expanded wafers Ua, Ub, and Uc, respectively. In the example as illustrated, the light emitting devices $Ea_1$, $Eb_1$, and $Ec_1$ correspond to the first light emitting devices to be inspected on the respective expanded wafers, and by the movement of the wafer chuck stage 4 via the XY stage 14, they are located under the corresponding probes $Pa_1$ and $Pa_2$, $Pb_1$ and $Pb_2$, and $Pc_1$ and $Pc_2$, respectively. It is to be noted that in FIG. 7, though the photodetectors 11a to 11c are not illustrated, the light emitting devices $Ea_1$, $Eb_1$, and $Ec_1$ are also located under the photodetectors 11a to 11c, respectively.

Figure 8:
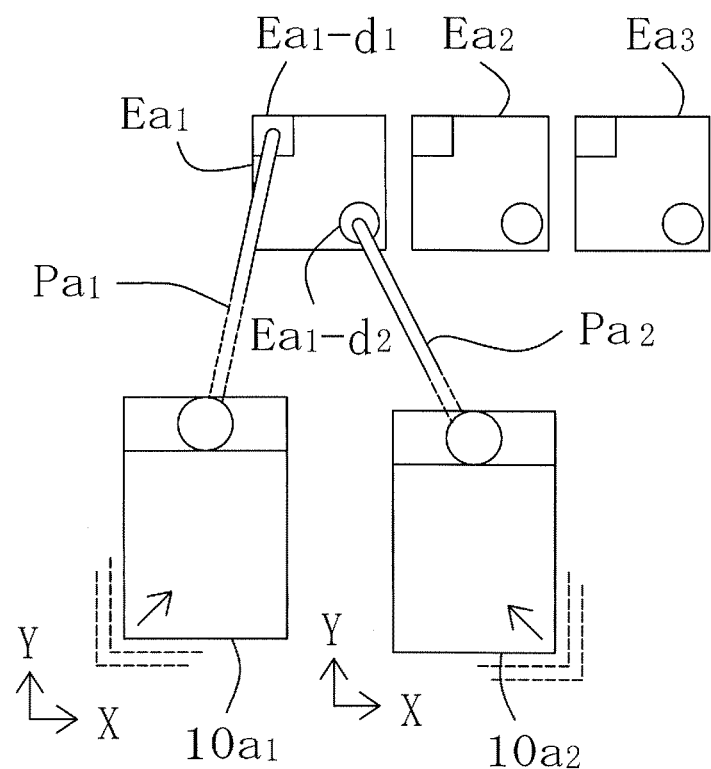
FIG. 8 is a schematic plan view showing the state for positioning each of the probes to each of the corresponding electrodes of the light emitting devices.

FIG. 8 illustrates the state where the probes $Pa_1$ and $Pa_2$ are being positioned to the places corresponding to the electrodes $Ea_1$-$d_1$ and $Ea_1$-$d_2$ of the light emitting device $Ea_1$ on the expanded wafer Ua. When the light emitting device $Ea_1$ to be inspected first is located under the corresponding probes $Pa_1$ and $Pa_2$ through the movement of the wafer chuck state 4 in the X-axis and/or Y-axis directions as described above, the control unit 13 subsequently actuates the probe moving stages $10a_1$ and $10a_2$ to move the probes $Pa_1$ and $Pa_2$ in X-axis and/or Y-axis directions based on the electrodes positional information stored in the position measurement unit 9 so as to place the probes $Pa_1$ and $Pa_2$ in the positions corresponding to the electrodes $Ea_1$-$d_1$ and $Ea_1$-$d_2$ respectively as shown in FIG. 8. This corresponds to the step d) of the inspection method according to the present invention.

It is to be noted that the aforementioned positions corresponding to the electrodes $Ea_1$-$d_1$ and $Ea_1$-$d_2$ mean the positions where the probes $Pa_1$ and $Pa_2$ are brought into contact with the electrodes $Ea_1$-$d_1$ and $Ea_1$-$d_2$ respectively, when the probes $Pa_1$ and $Pa_2$ are moved in the Z axis direction toward the wafer chuck stage 4 and made to approach the electrodes. While in FIG. 8, for the sake of convenience, the electrodes $Ea_1$-$d_1$ and $Ea_1$-$d_2$ of the light emitting device $Ea_1$ only are illustrated, the same procedures are applied to the case where the probes $Pb_1$ and $Pb_2$, $Pc_1$ and $Pc_2$ are positioned to the corresponding electrodes $Eb_1$-$d_1$ and $Eb_1$-$d_2$, $Ec_1$-$d_1$ and $Ec_1$-$d_2$ of the other light emitting device $Eb_1$ and $Ec_1$, which are simultaneously inspected with the light emitting device $Ea_1$.

When the positioning of the probes against the electrodes in the light emitting devices to be inspected first on each of the expanded wafers is completed as described above, the control unit 13 actuates the probe moving stages $10a_1$ to $10c_2$ to move the probes $Pa_1$ to $Pc_2$ in the direction of the Z axis toward the expanded wafers Ua to Uc on the wafer chuck stage 4, and allows the probes $Pa_1$ to $Pc_2$ to come into contact with the corresponding electrodes $Ea_1$-$d_1$ and $Ea_1$-$d_2$, $Eb_1$-$d_1$ and $Eb_1$-$d_2$, and $Ec_1$-$d_1$ and $Ec_1$-$d_2$, respectively.

The reference characters $Eb_1$-$d_1$ and $Eb_1$-$d_2$ indicate the electrodes of the light emitting device $Eb_1$ on the expanded wafer Ub. The reference characters $Ec_1$-$d_1$ and $Ec_1$-$d_2$ indicate the electrodes of the light emitting device $Ec_1$ on the expanded wafer Uc. The movement of the probes $Pa_1$ to $Pc_2$ toward the expanded wafers Ua to Uc in the Z-axis direction may be relative. It is alternatively possible to raise the expanded wafers Ua to Uc toward the respective probes $Pa_1$ to $Pc_2$, instead of lowering the respective probes $Pa_1$ to $Pc_2$ toward the expanded wafers Ua to Uc on the wafer chuck stage 4 as described above. However, as the wafer chuck stage 4 is equipped with three wafer chucks 5a to 5c in this example, the wafer chuck stage 4 is heavy in weight. Therefore, it is more preferable to move each of the probes $Pa_1$ to $Pc_2$ in the Z-axis direction, than to move the wafer chuck stage 4 in the Z-axis direction.

Test signals are supplied to the light emitting devices $Ea_1$, $Eb_1$, and $Ec_1$, respectively, through the probes $Pa_1$ to $Pc_2$ and the electrodes $Ea_1$-$d_1$ to $Ec_1$-$d_2$, and the photodetectors 11a to 11c detect the light emitted from the respective light emitting devices $Ea_1$, $Eb_1$, and $Ec_1$. With this procedure, the inspections on the optical properties of the light emitting devices $Ea_1$, $Eb_1$, and $Ec_1$ are performed. This corresponds to the step e) of the inspection method according to the present invention.

In the meantime, prior to the inspection of the optical properties, the control unit 13 is able to perform positioning of the photodetectors 11a to 11c at the locations optimum for the inspection. For Example, at the time when the test signals are supplied to the respective light emitting devices $Ea_1$, $Eb_1$, and $Ec_1$ through the respective probes $Pa_1$ to $Pc_2$, the control unit 13 moves the photodetectors 11a to 11c, independently, at least in the X-axis and/or Y-axis directions, or more preferably, in the X-axis, Y-axis, and/or Z-axis directions, via the photodetector moving stages 12a, 12b, and 12c, so that the light quantity detected by each of the photodetectors is maximized, thereby the photodetectors 11a to 11c are positioned at the places where they detect the maximum light quantity, respectively. The control unit 13 stores each of the places of the photodetectors 11a, 11b, and 11c, where the maximum light quantity is detected, as relative positions to either of the probe $Pa_1$ or $Pa_2$ for the photodetector 11a, either of the probe $Pb_1$ or $Pb_2$ for the photodetector 11b, and either of the probe $Pc_1$ or $Pc_2$ for the photodetector 11c.

It is preferable that the aforementioned positioning of the photodetectors 11a to 11c to the positions where the detected light quantity is maximized is performed in the aforementioned step e) for at least the first light emitting devices on the expanded wafers to be inspected. However, the positioning may be subsequently performed every appropriate number of devices for the inspection, and in extreme cases, the positioning may be performed in the aforementioned step e) for all of the light emitting devices which are to be inspected.

After the positioning of the photodetectors 11a to 11c at the positions where the detected light quantity is maximized, the control unit 13 performs the inspections on the optical properties of the light emitting devices $Ea_1$, $Eb_1$, and $Ec_1$ based on the measured data detected by the photodetectors 11a to 11c, respectively. The storage unit of the control unit stores the results of the inspections and/or the optical data being measured, and the stored information are used as appropriate. On this occasion, it is a matter of course that inspections on the electrical properties of the light emitting devices $Ea_1$, $Eb_1$, and $Ec_1$ may also be performed in addition to the optical inspections as mentioned above.

As described above, when the inspections on the first light emitting devices $Ea_1$, $Eb_1$, and $Ec_1$ are completed, the control unit 13 actuates the probe moving stages $10a_1$ to $10c_2$ again to raise the probes $Pa_1$ to $Pc_2$ in the direction of the Z axis. Subsequently, the control unit 13 moves the wafer chuck stage 4 in the X-axis and/or Y-axis directions via the XY stage 14 to move the light emitting devices $Ea_2$, $Eb_2$, and $Ec_2$ which are the second targets for the inspections to the places under the corresponding probes $Pa_1$ to $Pc_2$ and the photodetectors 11a to 11c, respectively. Then, similar to the aforementioned procedure, the positioning of the probes against the corresponding electrodes in the light emitting devices $Ea_2$, $Eb_2$, and $Ec_2$, respectively, lowering of the probes $Pa_1$ to $Pc_2$ in the Z-axis direction, and the inspections on the optical properties of each of the light emitting devices $Ea_2$, $Eb_2$, and $Ec_2$ are performed. Hereinafter, the light emitting devices targeted for the inspections are changed in the sequence of $Ea_1$, $Ea_2$, $Ea_3$, and so on, as indicated by the arrows in FIG. 7, for instance, and consequently, the inspections are performed in the similar manner as mentioned above on all the light emitting devices to be inspected on the expanded wafers Ua to Uc. This corresponds to the step f) in the inspection method according to the present invention.

Changing of the light emitting devices which becomes inspections target is performed by indexing the wafer chuck stage 4 in the directions of the X axis and/or the Y axis based on the light emitting devices positional information stored in the position measurement unit 9, so that the light emitting devices targeted for the next inspections are placed under the corresponding probes $Pa_1$ to $Pc_2$ and the photodetectors 11a to 11c, respectively. As described above, in the inspection apparatus and the inspection method of the present invention, chaining of the light emitting devices targeted for the inspections is conducted by indexing of the wafer chuck stage 4 based on the light emitting devices positional information measured in advance by the position measurement part 2. Therefore, even when the light emitting devices on each of the expanded wafers are variously spaced, it is possible to place the light emitting devices targeted for the inspections under the corresponding probes and photodetectors precisely and constantly.

Upon positioning of the probes to the corresponding electrodes in each of the light emitting devices targeted for the inspection, it is possible for the control unit 13 to switch the moving mode so as to move the photodetectors 11a to 11c in linking with the movement of any of the corresponding probes $Pa_1$ to $Pc_2$, thereby allowing the photodetectors 11a to 11c to move in the same directions of the X axis, the Y axis, and/or the Z axis and by the same shift amounts as the corresponding probes linked with the photodetectors 11a to 11c, respectively. Accordingly, when the photodetectors 11a to 11c are positioned at the optimum locations in terms of the relative positional relationships with the corresponding probes $Pa_1$ to $Pc_2$, the photodetectors 11a to 11c are constantly placed with respect to the probes $Pa_1$ to $Pc_2$ at the optimum locations where the detected light quantity is maximized, because the relative positional relationships between the photodetectors 11a to 11c and the corresponding probes $Pa_1$ to $Pc_2$ are maintained even when the positions of the probes $Pa_1$ to $Pc_2$ are changed for each of the light emitting devices.

At the time of probing, upon lowering or raising the probes $Pa_1$ to $Pc_2$ toward or from the expanded wafers Ua to Uc on the wafer chuck stage 4, it is preferable that the control unit 13 switches the moving mode so as to move the photodetectors 11a to 11c in linking with the movement of any of the corresponding probes $Pa_1$ to $Pc_2$, thereby the photodetectors 11a to 11c move in the Z-axis direction by the same shift amount as the corresponding probes linked with the photodetectors 11a to 11c, respectively. Thereby, it is possible to perform the probing under the conditions where the relative positional relationships between the probes $Pa_1$ to $Pc_2$ and the photodetectors 11a to 11c are maintained.

When the inspections on the optical properties of all the light emitting devices on the expanded wafers Ua to Uc are completed as described above, the control unit 13 moves the wafer chuck stage 4 from the position of the inspection part 3 to the position of the position measurement part 2, in the opposite direction to those indicated by the arrow in FIG. 5 and FIG. 6. When the wafer chuck stage 4 returns to the position of the position measurement part 2, the wafer transfer equipment 8 is actuated and unloads from the wafer chucks 5a to 5c the expanded wafers Ua to Uc as to which the inspections have been completed. Next expanded wafers Ud to Uf are loaded on the wafer chucks 5a to 5c which have become empty without interruption and the same inspections are performed.

In the aforementioned example, the number of the wafer chucks 5a to 5c mounted on the wafer chuck stage is three. However, it may possible to mount more than one wafer chucks on the wafer chuck stage 4, for example, two or more than three wafer chucks can be preferably mounted on the wafer chuck stage 4. Whatever the cases, according to the inspection apparatus and the inspection method of the present invention, light emitting devices on more than one expanded wafers are inspected simultaneously. Therefore, the number of devices inspected per unit time becomes a multiple of the number of the wafer chucks mounted on a wafer chuck stage, thereby drastic increase of the number of inspected devices is realized.

In the aforementioned example, all of the light emitting devices on the expanded wafers Ua to Uc on the wafer chucks 5a to 5c are inspected. However, there exist sometimes one or more light emitting devices which do not need or is not able to be inspected on the expanded wafers Ua to Uc. In such occasions, the probes and the photodetectors corresponding to the light emitting devices which do not need or is not able to be inspected can be raised in the direction of the Z axis thereby putting aside them to the positions not to contact with the light emitting devices in question, even when the wafer chuck stage 4 is relatively raised with respect to the probes $Pa_1$ to $Pc_2$.

Figure 9:
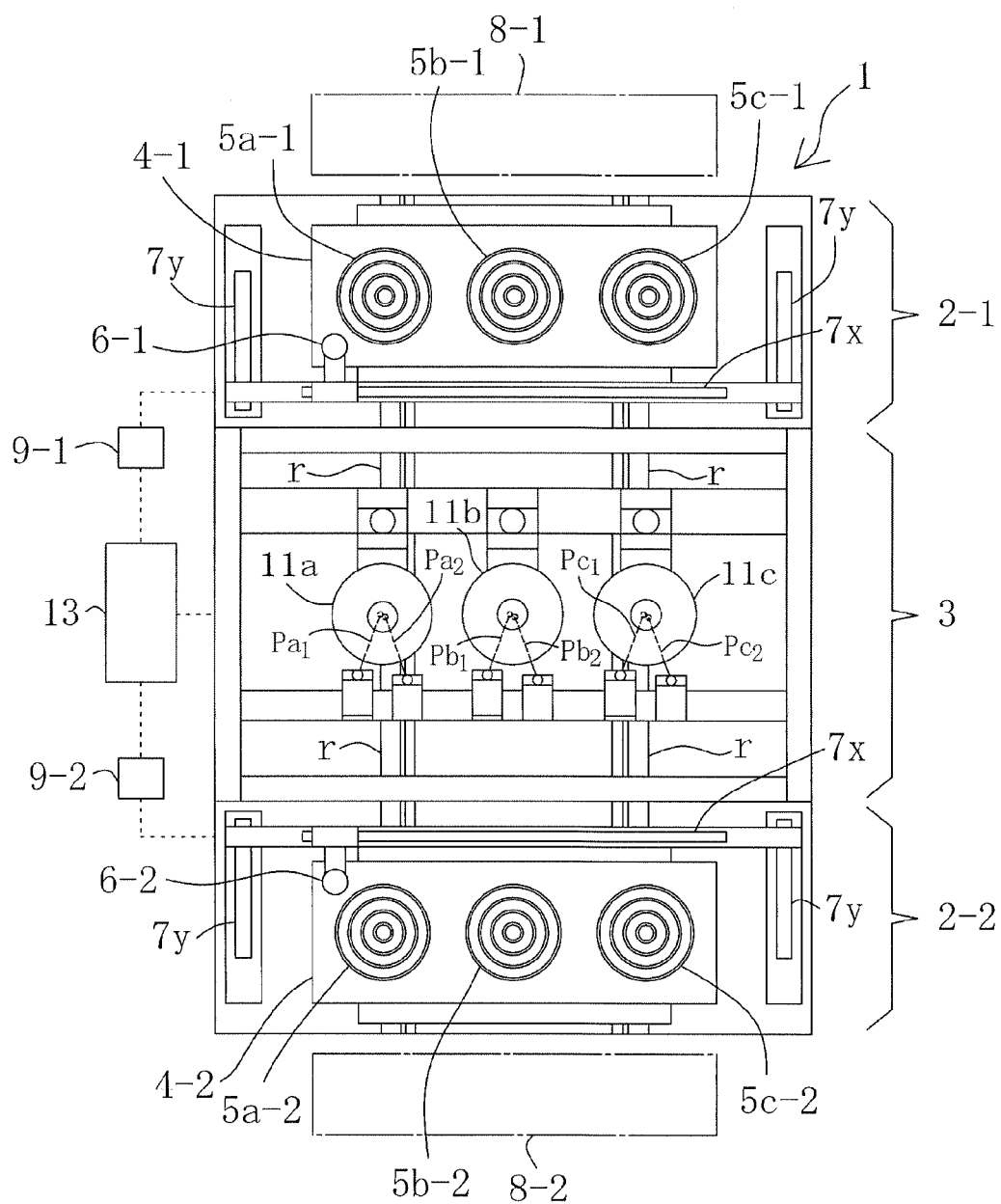
FIG. 9 is a plan view showing another example of the inspection apparatus according to the present invention.
Figure 10:
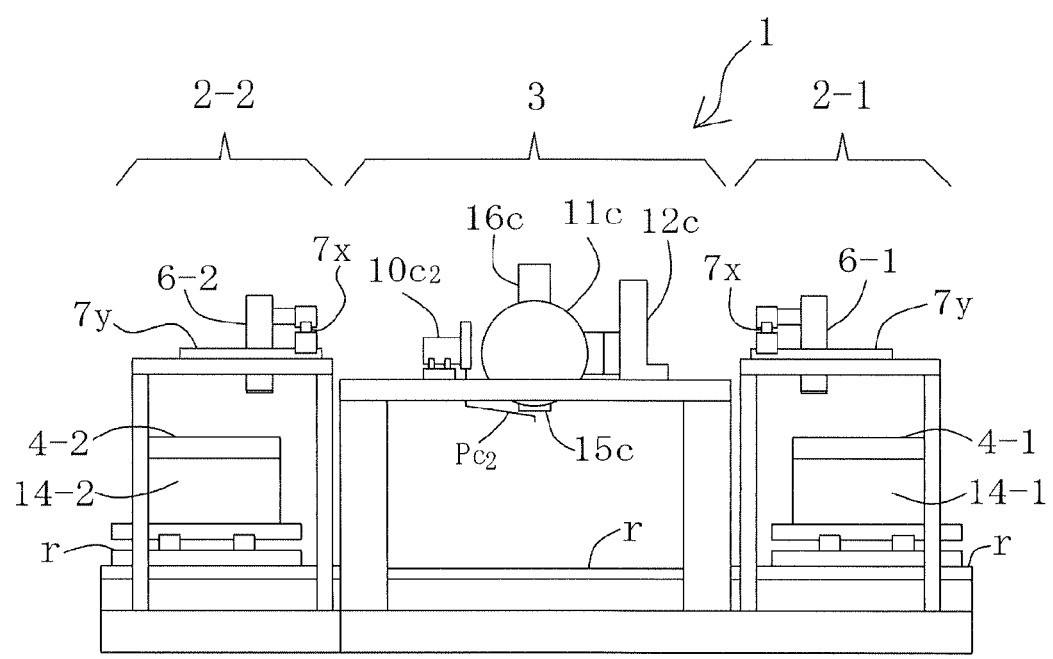
FIG. 10 is a right side view showing the another example of the inspection apparatus for the light emitting devices according to the present invention.

FIG. 9 is a plan view showing an alternative example of the inspection apparatus 1 according to the present invention, and FIG. 10 is a right side view thereof. The inspection apparatus 1 as shown in FIG. 9 and FIG. 10 is different from the aforementioned inspection apparatus 1 in the point that two position measurement parts 2-1 and 2-2 are provided for one inspection part 3. The position measurement parts 2-1 and 2-2 are basically the same as the position measurement part 2 as shown in FIG. 1 and FIG. 2. The position measurement parts 2-1 and 2-2 are respectively provided with the wafer chuck stages 4-1 and 4-2, the cameras 6-1 and 6-2, the position measurement units 9-1 and 9-2. In addition, the wafer chuck stages 4-1 and 4-2 are respectively equipped with three wafer chucks 5a-1, 5b-1, and 5c-1, and three wafer chucks 5a-2, 5b-2, and 5c-2. It is to be noted that reference numerals 8-1 and 8-2 indicate wafer transfer equipments appropriately provided.

The Y-axis rail r is laid between the position measurement part 2-2 and the inspection part 3 in the same manner as the Y-axis rail r laid between the position measurement part 2-1 and the inspection part 3. Therefore, the wafer chuck stage 4-2 is allowed to move between the position measurement part 2-2 and the inspection part 3, and in the same manner, the wafer chuck stage 4-1 is allowed to move between the position measurement part 2-1 and the inspection part 3. In the position measurement part 2-1 or 2-2, the location of the wafer chuck stage 4-1 or 4-2 where the position measurements are performed for the light emitting devices on the expanded wafers by the camera 6-1 or 6-2 is referred to as "position measurement location", and in the inspection part 3, the location of the wafer chuck stage 4-1 or 4-2 where the inspections are performed on the optical properties of the light emitting devices on the expanded wafers is referred to as "inspection location". Therefore, it is configured in such a manner that each of the wafer chuck stages 4-1 and 4-2 is movable between the respective position measurement location and the common inspection location.

An alternative example of the inspection method according to the present invention, which is practiced by using the aforementioned inspection apparatus 1, will be explained.

Firstly, FIG. 9 shows the state that the wafer chuck stages 4-1 and 4-2 are placed at the respective position measurement locations, and no expanded wafers are loaded on each of the wafer chucks yet. From this state, the steps a) and b) similar to those in the inspection method of the present invention described above are performed for the wafer chuck stage 4-1 at the position measurement location in the position measurement part 2-1.

First, the wafer transfer equipment 8-1 is actuated to load the expanded wafers Ua to Uc on the wafer chucks 5a-1 to 5c-1 mounted on the wafer chuck stage 4-1, respectively. When the expanded wafers Ua to Uc are loaded on the wafer chucks 5a-1 to 5c-1, the position measurement unit 9-1 is actuated to move the camera 6-1 along the guides 7x and 7y in the X-axis and Y-axis directions, measure the relative positions of each of the light emitting devices on the expanded wafers Ua to Uc with respect to a standard point, and store the thus measured relative positions as light emitting devices positional information. On this occasion, the positions of the electrodes in the light emitting devices can be also measured by the position measurement unit 9-1 and can be also stored as the electrodes positional information. This is same as in the aforementioned example of the present invention. In addition, if necessary, the wafer chucks 5a-1 to 5c-1 are turned in the θ axis direction to make the array direction of the light emitting devices on the expanded wafers Ua to Uc coincident with the directions of the X axis and/or the Y axis of the guides 7x and 7y for the camera 6-1. This is same as in the aforementioned example of the present invention.

Figure 11:
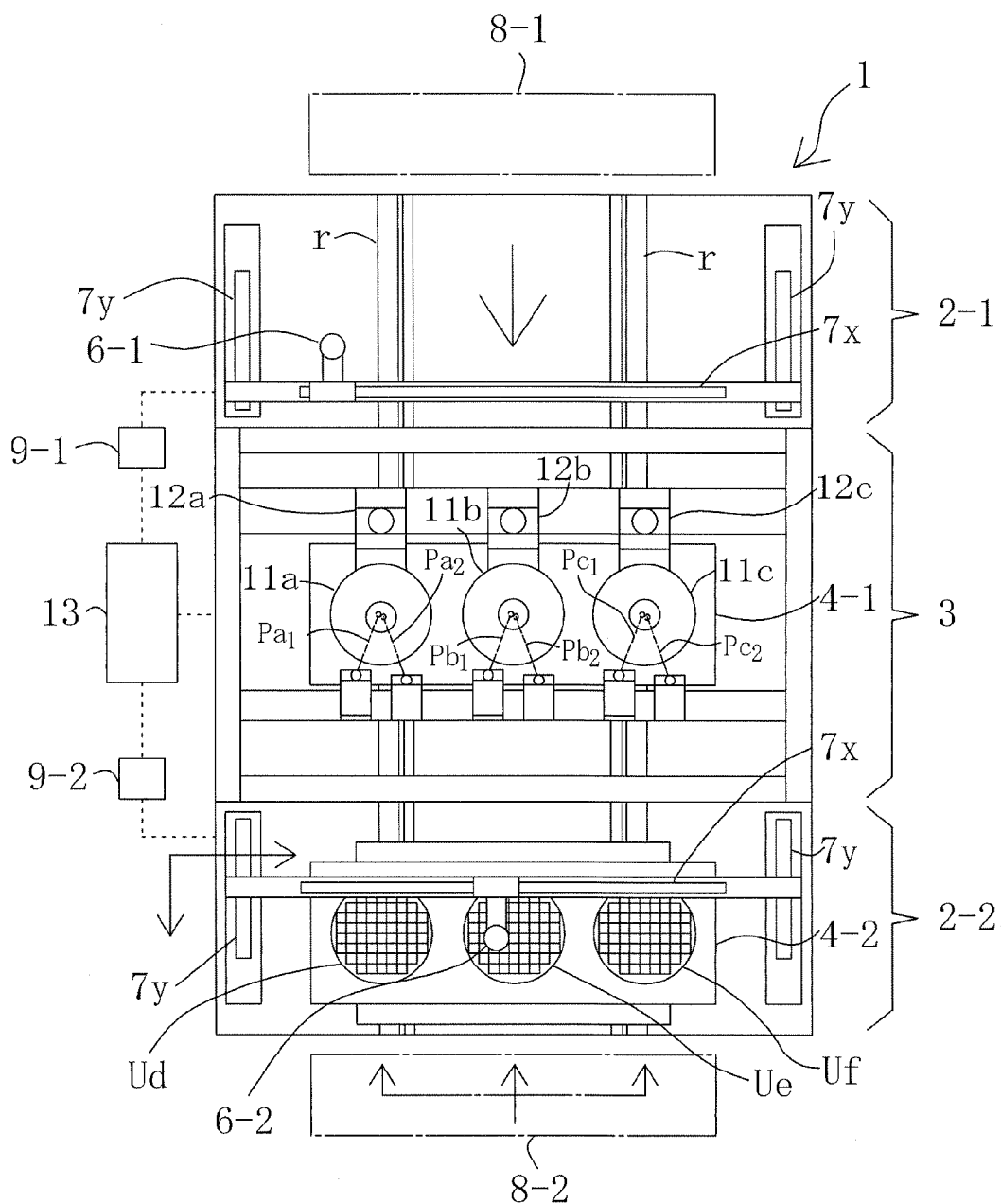
FIG. 11 is a plan view showing a state of the inspection apparatus which is shown in FIG. 9.

When the position measurements of the light emitting devices are completed, the control unit 13 is actuated to move the wafer chuck stage 4-1 from the position measurement location to the common inspection location in the inspection part 3. FIG. 11 is a plan view showing this state. As shown in FIG. 11, the wafer chuck stage 4-1 on which the expanded wafers Ua to Uc are loaded has been moved to the inspection location, and at the location, the steps c), d), e), and f) are performed in the same manner as the aforementioned example.

Simultaneously in parallel, in the similar manner as performed for the wafer chuck stage 4-1, the steps a) and b) of the inspection method of the present invention as described above are performed for the wafer chuck stage 4-2 in the position measurement location in the position measurement part 2-2. In other words, the wafer transfer equipment 8-2 in the position measurement part 2-2 is actuated, and, as shown in FIG. 11, loads the expanded wafers Ud to Uf on the wafer chucks 5a-2 to 5c-2 equipped on the wafer chuck stage 4-2, respectively. When the expanded wafers Ud to Uf are loaded on the wafer chucks 5a-2 to 5c-2, the position measurement unit 9-2 is actuated to move the camera 6-2 along the guides 7x and 7y in the directions of the X axis and/or the Y axis, measure the relative positions of each of the light emitting devices on the expanded wafers Ud to Uf with respect to a standard point, and store thus measured relative positions in the position measurement unit 9-2 as the light emitting devices positional information. On this occasion, the positions of the electrodes in the light emitting devices can be also measured by the position measurement unit 9-2 and can be also stored as the electrodes positional information. This is same as in the aforementioned example of the present invention. In addition, if necessary, the wafer chucks 5a-2 to 5c-2 are turned in the θ axis direction to make the array directions of the light emitting devices on the expanded wafers Ud to Uf coincident with the directions of the X axis and/or the Y axis of the guides 7x and 7y for the camera 6-2. This is same as in the aforementioned example of the present invention.

Figure 12:
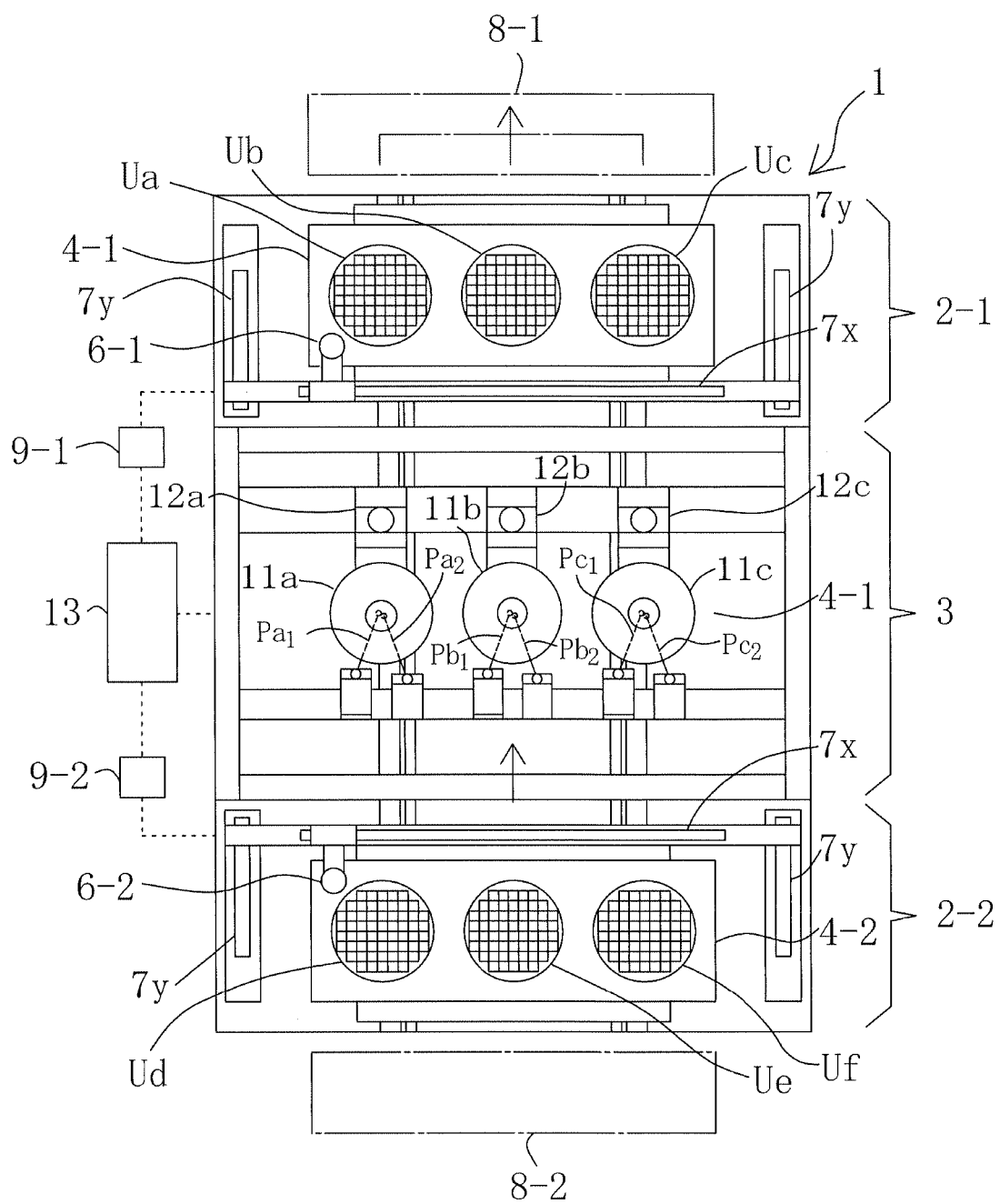
FIG. 12 is a plan view showing another state of the inspection apparatus which is shown in FIG. 9.

Next, upon completing the aforementioned steps c), d), e), and f) for the wafer chuck stage 4-1 at the inspection location in the inspection part 3, and when the inspections on all of the light emitting devices on the expanded wafers Ua to Uc are finished, the control unit 13 moves the wafer chuck stage 4-1 from the inspection location to the position measurement location, where the wafer chuck stage 4-1 initially existed, in the position measurement part 2-1 as shown in FIG. 12. Subsequently, the wafer transfer equipment 8-1 is actuated and unloads from the wafer chuck stage 4-1 the expanded wafers Ua to Uc as on which the inspections have been completed.

After having confirmed that the wafer chuck stage 4-1 does not exist at the inspection location in the inspection part 3, the control unit 13 moves the wafer chuck stage 4-2 from the position measurement location in the position measurement part 2-2 to the inspection location in the inspection part 3 as indicated by the arrow in FIG. 12. Similar to the case for the wafer chuck stage 4-1, the aforementioned steps c), d), e), and f) are performed for the wafer chuck stage 4-2 that has been moved to the inspection location in the inspection part 3, and the inspections are performed on all of the light emitting devices to be inspected on the expanded wafers Ud to Uf being loaded.

It is to be noted that the confirmation that the wafer chuck stage 4-1 does not exist at the inspection location in the inspection part 3 can be conducted by, for example, electrically, photo-electrically, or electromagnetically detecting the non-presence of the wafer chuck stage 4-1 at inspection location, or by detecting the presence of the wafer chuck stage 4-1 at the position measurement location in the position measurement part 2-1 using the similar detecting means as described above. The confirmation that wafer chuck stage 4-2 does not exist at the inspection location in the inspection part 3 can be performed similarly.

Simultaneously in parallel with the aforementioned steps c), d), e), and f) which are performed for the wafer chuck stage 4-2, the wafer transfer equipment 8-1 loads the expanded wafers Ug to Ui targeted for the next inspections on the wafer chuck stage 4-1, and after that, the inspections of the light emitting devices are performed continuously in the same manner.

As described above, according to the inspection method of the present example, during the period where the inspections of the light emitting devices are being performed on the expanded wafers loaded on one wafer chuck stage, it is possible to measure the positions of the light emitting devices, more preferably, the positions of the electrodes in the light emitting devices as well as the positions of the light emitting devices on the expanded wafers loaded on the other wafer chuck stage. Therefore, immediately after having finished the inspections on the expanded wafers loaded on the one wafer chuck stage, the other wafer chuck stage can be moved to the inspection location in the inspection part 3 to start the inspections, thereby minimizing idle time of the inspection part 3 and drastically increasing the number of devices inspected per unit time.

It is good enough that at least a part of the aforementioned steps c), d), e) and f) performed for one wafer chuck stage overlaps the aforementioned steps a) and b) performed for the other wafer chuck stage in time wise. However, it is more desirable that overall or most of those steps above mentioned overlap each other in time wise. It is also desirable that at least in part or whole of the step b) on one wafer chuck stage, where position measurements of the light emitting devices on the expanded wafers are performed, overlaps in time wise the steps c), d), e), and f) on another wafer chuck stage, where the inspections are performed on the optical properties of the light emitting devices on the expanded wafers.

In the examples discussed above, two position measurement parts 2-1 and 2-2 are provided for one inspection part 3. However, the number of the position measurement parts 2 provided for one inspection part 3 is not limited to two. For example, four position measurement parts 2-1 to 2-4 may be provided for one inspection part 3, in such a manner as being arranged at locations spaced at 90 degrees from one another on the plane. This example is advantageous when measuring the positions takes relatively longer time than performing inspections.

As stated above, according to the inspection apparatus and the inspection method of the present invention, it is possible to perform the inspections efficiently on the optical properties of the light emitting devices on the expanded wafers, which had been difficult so far. According to the inspection apparatus and the inspection method of the present invention, it is possible to increase the number of devices inspected per unit time, thereby enabling a drastic reduction of cost for inspections. Consequently, the present invention has a significant industrial applicability in the field of industries relating to a manufacture of a light emitting device such as an LED device.

What is claimed is:

1. An inspection apparatus for light emitting devices on an expanded wafer, comprising,
   1) a position measurement part comprising a wafer chuck stage equipped with more than one wafer chucks, and a position measurement unit which measures relative positions to a standard point, of the light emitting devices on each of the expanded wafers loaded on the wafer chucks, and stores the relative positions as light emitting devices positional information,
   2) an inspection part comprising a photodetector and one or more than one probes provided per each of the expanded wafers loaded on the wafer chucks, and probe moving stages which move each of the probes independently in the X-axis, Y-axis, and Z-axis directions, and
   3) a control unit comprising,
   means for moving the wafer chuck stage in at least one of the X-axis direction and the Y-axis direction in such a manner that the light emitting devices on each of the expanded wafers are sequentially placed under the corresponding one or more than one probes, based on the light emitting devices positional information,
   means for actuating the probe moving stages to move each of the probes in at least one of the X-axis direction and the Y-axis direction, based on the light emitting devices positional information and positional information of electrodes in the light emitting devices, so that each of the probes is brought to a place corresponding to each of the electrodes in the light emitting devices under the probes, and
   means for moving the probes in the Z-axis direction with respect to the wafer chuck stage so as to bring the probes into contact with the corresponding electrodes in the light emitting devices.

2. The inspection apparatus for light emitting devices according to claim 1, wherein,
   the position measurement unit measures, in addition to the light emitting devices positional information, relative positions to a standard point, of the electrodes in each of the light emitting devices, and stores the measured relative positions as the electrodes positional information.

3. The inspection apparatus for light emitting devices according to claim 1, wherein,
   the inspection part comprises photodetector moving stages which move each of the photodetectors independently in the X-axis, Y-axis, and Z-axis directions, and means for moving each of the photodetectors in at least one of the X-axis direction, the Y-axis direction and the Z-axis direction in linking with the movement of the corresponding any of one or more than one probes.

4. The inspection apparatus for light emitting devices according to claim 1, which comprises two or more the position measurement parts for one inspection part, wherein,
   the inspection part and each of the position measurement parts are placed at locations different from one another, and
   the control unit comprises,
   means for moving the wafer chuck stage between the inspection part and each of the position measurement parts,
   means for moving one of the wafer chuck stages from one of the position measurement parts to the inspection part, after having been stored the light emitting devices positional information, or both of the light emitting devices positional information and the electrodes positional information by the position measurement unit, when the other wafer chuck stage does not exist in the inspection part, and
   means for moving one of the wafer chuck stages, after having been completed the inspections in the inspection part, from the inspection part to the position measurement part.

5. An inspection method for light emitting devices on an expanded wafer, comprising,
   a) a step of loading the expanded wafers on respective wafer chucks provided in plural on a wafer chuck stage,
   b) a step of measuring relative positions to a standard point, of the light emitting devices on each of the expanded wafers loaded on the wafer chucks, and storing the relative positions, as light emitting devices positional information,
   c) a step of moving the wafer chuck stage in at least one of the X-axis direction and the Y-axis direction based on the light emitting devices positional information to place the light emitting devices to be inspected on each of the expanded wafers under a photodetector and one or more than one probes being provided corresponding to each of the expanded wafers loaded on the wafer chucks,
   d) a step of moving each of the probes in at least one of the X-axis direction and the Y-axis direction, based on the light emitting devices positional information and electrodes positional information in each of the light emitting devices, to bring each of the probes to a location corresponding to each of the electrodes of the light emitting devices positioned below,
   e) a step of moving the probes in the Z-axis direction with respect to the wafer chuck stage, to bring each of the probes into contact with the corresponding electrodes in the light emitting devices respectively, and performing inspections of the light emitting devices, and
   f) a step of changing the light emitting device targeted for the inspections on each of the expanded wafers, and repeating the steps of the aforementioned c), d), and e) for all of the light emitting devices to be inspected on each of the expanded wafers.

6. The inspection method for light emitting devices according to claim 5, wherein,
   the step b) further comprises a step of measuring relative positions to a standard point, of the electrodes on the light emitting devices and storing the relative positions as the electrodes positional information in addition to the light emitting devices positional information.

7. The inspection method for light emitting devices according to claim 5, wherein,
   the step d) further comprises a step of moving each of the photodetectors in at least one of the X-axis direction and the Y-axis direction in linking with the movement of any of the corresponding probes in at least one of the X-axis direction and the Y-axis direction.

8. The inspection method for light emitting devices according to claim 5, wherein,
   the step e) further comprises a step of moving each of the photodetectors in the Z-axis direction in linking with the movement of any of the corresponding probes in the Z-axis direction.

9. The inspection method for light emitting devices according to claim 5, wherein,
   at least the step e) performed first, among the steps e) performed on all the light emitting devices to be inspected on each of the expanded wafers, comprises a step of moving each of the photodetectors in at least one of the X-axis direction and the Y-axis direction independent from the corresponding probes to position each of the photodetectors at a place where a light quantity being detected is maximized.

10. The inspection method for light emitting devices according to claim 5, wherein two or more wafer chuck stages are moved between a respective position measurement location and a common inspection location, and wherein,
    following steps are performed for each of the wafer chuck stages;
    g) a step of performing the steps a) and b) at the position measurement location,
    h) a step of moving the wafer chuck stage from the position measurement location to the common inspection location,
    i) a step of performing the steps c) to f) at the common inspection location,
    j) a step of moving the wafer chuck stage from the common inspection location to the position measurement location, and
    k) a step of unloading the expanded wafers from the wafer chucks at the position measurement location, and
    the step i) for one of the wafer chuck stages is performed simultaneously with the step g) for the other one or more wafer chuck stages at least partially in parallel.

* * * * *